United States Patent [19]

Glang et al.

[11] Patent Number: 4,467,519
[45] Date of Patent: Aug. 28, 1984

[54] PROCESS FOR FABRICATING POLYCRYSTALLINE SILICON FILM RESISTORS

[75] Inventors: Reinhard Glang, Somers; San-Mei Ku, Poughkeepsie, both of N.Y.; Alfred Schmitt, Boeblingen, Fed. Rep. of Germany

[73] Assignee: International Business Machines Corporation, Armonk, N.Y.

[21] Appl. No.: 384,371

[22] Filed: Apr. 1, 1982

[51] Int. Cl.³ ............... H01L 21/263; H01L 21/26; H01L 21/425
[52] U.S. Cl. .................... 29/576 B; 148/1.5; 148/187; 357/34; 357/51; 357/91
[58] Field of Search ............ 148/1.5, 187; 357/91, 357/51, 34; 29/576 B

[56] References Cited

U.S. PATENT DOCUMENTS

| | | | |
|---|---|---|---|
| 3,432,792 | 3/1969 | Hatcher, Jr. | 338/311 |
| 3,558,374 | 1/1971 | Boss et al. | 148/174 |
| 3,576,478 | 4/1971 | Watkins et al. | 317/235 |
| 4,063,210 | 12/1977 | Collver | 338/7 |
| 4,157,269 | 6/1979 | Ning et al. | 148/1.5 |
| 4,199,778 | 4/1980 | Masuhara et al. | 357/59 |
| 4,209,716 | 6/1980 | Raymond, Jr. | 357/59 |
| 4,210,465 | 7/1980 | Brower | 148/1.5 |
| 4,212,684 | 7/1980 | Brower | 148/1.5 |
| 4,214,917 | 7/1980 | Clark et al. | 148/1.5 |
| 4,229,502 | 10/1980 | Wu et al. | 427/53.1 |
| 4,240,097 | 12/1980 | Raymond, Jr. | 357/71 |
| 4,256,515 | 3/1981 | Miles et al. | 148/1.5 |
| 4,290,185 | 9/1981 | McKenny et al. | 29/571 |
| 4,394,191 | 7/1983 | Wada et al. | 148/1.5 |
| 4,411,708 | 10/1983 | Winham | 148/1.5 |
| 4,431,460 | 2/1984 | Barson et al. | 148/1.5 |

OTHER PUBLICATIONS

IBM Technical Disclosure Bulletin, vol. 23, No. 7A, Dec. 1980, "Polysilicon Resistor Fabrication", by J. R. Lloyd et al., pp. 2811-2812.
Sakurai et al., Jap. Jour. Appl. Phys., 19 (1980), Supplement 19-1, 181-185.
Seto, Jour. Appl. Phys., 46 (1975), 5247.
Ning, IBM-TDB, 23 (1980), 368.
Berndlmaier et al., IBM-TDB, 24 (Apr. 1982), 5619.

*Primary Examiner*—Upendra Roy
*Attorney, Agent, or Firm*—George O. Saile

[57] ABSTRACT

A method for fabricating polycrystalline silicon resistors is described which includes deposition of a polycrystalline silicon layer of very fine grain size upon an insulator surface, followed by ion implantation of boron equal to or slightly in excess of the solubility limit of the polycrystalline silicon. This ion implantation is normally done using a screen silicon dioxide surface layer. The structure may be annealed at temperatures of between about 800° C. to 1100° C. for 15 to 180 minutes to control the grain size of the polycrystalline silicon layer, homogenize the distribution of the boron ions throughout the entire film thickness and to raise the concentration of the boron in the silicon grains to the solid solubility limit. The suitable electrical contacts are now made to the polycrystalline silicon layer to form the resistor.

17 Claims, 6 Drawing Figures

PROCESS FOR FABRICATING POLYCRYSTALLINE SILICON FILM RESISTORS

FIELD OF THE INVENTION

The present invention is directed to a method of manufacturing polycrystalline film resistors having a high degree of sheet resistance control and very low temperature coefficient of resistance.

BACKGROUND OF THE INVENTION

Polycrystalline silicon films have been used in integrated circuits for many years, for example, the U.S. Pat. No. 3,558,374 by D. W. Boss et al. and assigned to the present assignee describes a method for controlling grain size of polycrystalline films so that PN junctions may be formed in the film.

The preferred polycrystalline silicon deposition process is thermal decomposition of silane either at reduced pressure and temperatures from 600° C. to 700° C. or at atmospheric pressure and temperatures of the order of 1000° C. to 1200° C. In most cases, the doping element has been introduced during the deposition process. Better control of the total amount of impurity is obtained if the conductivity imparting impurity is incorporated into the film after the deposition of the film by ion implantation. In that case, a post ion implantation annealing up to 1100° C. is needed to assure uniform impurity distribution throughout the films.

The polycrystalline silicon films have been widely used in large scale integrated circuit devices, to provide gates for field effect transistor devices, device contact regions in bipolar transistors or as resistors. Process economies can be gained by using the available polycrystalline silicon films as resistors in large scale integrated circuits. The following patents and publications are examples of ion implanted polycrystalline silicon resistor methods and resulting products for a variety of uses. O. W. Hatcher, Jr. U.S. Pat. No. 3,432,792 describes a moat filled polycrystalline diffused resistor. M. W. Collver U.S. Pat. No. 4,063,210 describes a polycrystalline resistor having very small grain size and having dopants from the group consisting of nickel and cobalt dispersed in a super saturated solid solution in the film. B. G. Watkins et al. U.S. Pat. No. 3,576,478 describes a field effect transistor having a polycrystalline silicon resistor associated therewith. T. Masuhara et al. U.S. Pat. No. 4,199,778 describes the ion implantation of boron, phosphorus or arsenic into a polycrystalline silicon layer in the amount of about $1 \times 10^{19}$ atoms/cm$^3$ to form a polycrystalline silicon resistor. J. H. Raymond, Jr. U.S. Pat. Nos. 4,209,716 and 4,240,097 describes the method for manufacturing ion implanted lightly-doped polycrystalline silicon resistive layers which are useful as a load and a static RAM memory cell. R. W. Brower U.S. Pat. Nos. 4,210,465 and 4,212,684 describes method and resulting polycrystalline silicon structure wherein the polycrystalline silicon resistor is formed on a field silicon dioxide layer. K. L. Clark et al. U.S. Pat. No. 4,214,917 teaches the formation of a polycrystalline silicon resistor of relatively low resistivity by ion implantation with phosphorus with a dosage level in the general range of $10^{13}$ to $10^{14}$ ions/cm$^2$. S. W. Miles et al. U.S. Pat. No. 4,256,515 describes the formation of high resistivity polycrystalline silicon resistors formed over the field silicon dioxide layer. The resistivity of the resistors is established by ion implantation of impurities such as boron. The J. R. Lloyd et al. Technical Disclosure Bulletin, Vol. 23, No. 7A, Dec. 1980, pp. 2811-2812 describe a polycrystalline silicon resistor fabrication which utilizes low energy ion implantation to dope a polycrystalline film to the desired resistivity. They describe a power level of about 10 to 500 KeV and a dosage of about $10^{12}$ to about $10^{17}$ ions/cm$^2$ but for a film of about 500 nanometers in thickness. After the ion implantation the polycrystalline silicon is flash laser annealed to electrically activate the implanted impurities.

SUMMARY OF THE PRESENT INVENTION

In accordance with the present invention there is described a method for fabricating polycrystalline silicon film resistors preferably in conjunction with a bipolar large scale integrated process for making integrated circuits. Bipolar integrated circuit processes often utilize heavily doped boron polycrystalline silicon regions to provide extrinsic bases for the transistors.

The polycrystalline silicon resistor films are doped with boron to the solid solubility limit or slightly above that limit. Of practical interest is the controllability of the polycrystalline film resistivity and its temperature dependence as effected by process variables. Another important parameter in the success of the present process is the maintainence of a fine polycrystalline silicon grain size.

The method for fabricating polycrystalline silicon resistors includes deposition of a polycrystalline silicon layer of very fine grain size upon an insulator surface, followed by ion implantation of boron equal to or slightly in excess of the solubility limit of the polycrystalline silicon. This ion implantation is normally done using a screen silicon dioxide surface layer. The structure may be annealed at temperatures of between about 800° C. to 1100° C. for 15 to 180 minutes to control the grain size of the polycrystalline silicon layer, homogenize the distribution of the boron ions throughout the entire film thickness and to raise the concentration of the boron in the silicon grains to the solid solubility limit. The suitable electrical contacts are now made to the polycrystalline silicon layer to form the resistor.

There is also described a method for forming integrated circuits which includes an NPN bipolar transistor and a resistor. A silicon semiconductor body having regions of monocrystalline silicon dielectrically isolated from one another by dielectric (isolating) regions is provided. A mask is formed over the surface of the silicon body having the isolating regions therein covering all regions except those regions designated to be the extrinsic base regions. A polycrystalline silicon layer of very fine grain size is deposited over the mask and the designated extrinsic base regions. Boron is ion implanted into the polycrystalline layer in an amount equal to or slightly in excess of the solid solubility limit of the polycrystalline silicon. The structure is then annealed to simultaneously control the grain size in the polycrystalline silicon layer and to drive in the boron from the layer into the designated external base region. Portions of the polycrystalline silicon layer are removed by standard lithographic and etching techniques to delineate the external base contact and the resistors in the polycrystalline silicon layer. Contacts are then made to the external base contacts and to the resistor layer.

DESCRIPTION OF THE PREFERRED EMBODIMENTS

Figure 1:
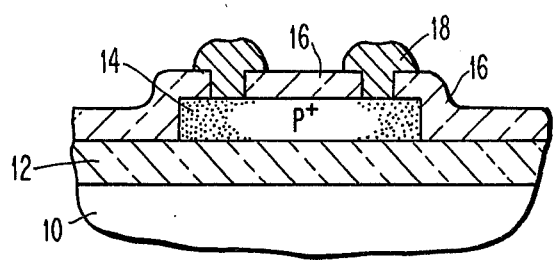
FIG. 1 schematically illustrates a vertical cross-section of a polycrystalline silicon resistor made according to one form of the present invention.

Referring now more particularly to FIG. 1 there is shown a greatly enlarged cross-sectional view of a semiconductor structure formed upon a wafer 10. Typically the wafer 10 is silicon, however, it could be a sapphire, spinell or the like crystal wafer. A thin insulating layer 12 is formed over the wafer 10. This insulating layer can be any of the common insulating materials such as thermally grown silicon dioxide where a silicon wafer is utilized, a vapor deposited silicon dioxide, silicon nitride, alumina or the like, or insulating layers deposited by other conventional techniques. The thickness of this insulating layer is typically 50 to 1000 nanometers.

A polycrystalline silicon deposition process is next used to form a polycrystalline silicon film 14 with a fine grain structure. It is preferred to form such a polycrystalline silicon film by the pyrolysis of silane at low temperatures such as between about 600° to 750° C. There are various other processes which may be used to form polycrystalline silicon films, such as the plasma enhanced vapor deposition process or other chemical vapor reactions, high vacuum evaporation or sputtering processes.

The introduction of the conductivity imparting boron impurities is made at concentrations equal to or slightly in excess of their solid solubility limit in polycrystalline silicon. The important concept is to control the free carrier concentration through the solid solubility of the impurity element which is the function of the process temperature. Excess impurities are electrically neutral for all practical purposes. For boron, the limiting concentration has been determined to be about $7 \times 10^{19}$ atoms/cm$^2$ at 900° C., $1 \times 10^{20}$ atoms/cm$^2$ at 1000° C. and $1.1 \times 10^{20}$ atoms/cm$^2$ at 1100° C. The preferred method of introducing impurities is through ion implantation. Diffusion of gaseous doping during polycrystalline deposition provides less assurance of controlling the total amount of impurities in the resulting polycrystalline silicon films. It is preferred that a layer of silicon dioxide is formed by thermal oxidation or chemical vapor deposition in the order of 100 nanometers on the surface of the polycrystalline silicon layer 14 prior to the ion implantation of the boron impurity into the polycrystalline silicon film 14. The purpose of this screen oxide film is to avoid loss of boron through evaporation from the polycrystalline silicon film in subsequent annealing steps. The preferred dosage of boron ions in the ion implantation process depends upon the specific thickness of the polycrystalline silicon layer.

The polycrystalline silicon film is now heat treated or annealed at temperatures above the film deposition temperature. This annealing step is designed to accomplish several objectives. The first objective is to homogenize the distribution of the doping element, boron, throughout the entire film thickness. If this is not accomplished, the films may change in resistivity during later temperature cycling. Secondly, it raises the concentration of the boron doping element in the silicon grains to the solid solubility limit. The latter depends on the anneal temperature which therefore determines the concentration of electrically active carriers in the resistive semiconductor film. Thirdly, it recrystalizes the silicon film whereby a distribution of grain sizes characterized by a mean value, L, is obtained. This mean value, L, increases with annealing temperature and can be determined empirically, for example, by quantative evaluation of transmission electron microscope photographs. For a 300 nanometer thick film deposited by the pyrolysis of silane at 625° C., the following relationship between the mean grain size, L, and the annealing temperature has been found:

For a temperature of 900° C. with 1 hour of annealing, L equals approximately 40 nanometers;

for a temperature of 1000° C. with 1 hour anneal, L equals about 84 nanometers; and for a temperature of 1100° C. with 1 hour anneal, L equals about 135 nanometers.

The significance of controlling L lies in the fact that this parameter determines the resistivity and the temperature coefficient of resistance, TCR, of the resulting films.

The polycrystalline silicon film structure is now delineated by conventional lithography and etching techniques to form the desired resistor areas. An insulating film 16, such as silicon dioxide or a combination of silicon dioxide and silicon nitride is chemical vapor deposited onto the polycrystalline silicon surface 14 and the insulating layer surface 12. Openings are made in the chemically vapor deposited insulating layer 16 and the desired contact areas to the polycrystalline silicon film resistor 14 by conventional lithograp;hy and etching techniques. A blanket metallization 18 is formed on the surface of the insulation layer 16. This layer 18 makes contact to the polycrystalline silicon resistor film 14 through the openings in the layer 16. Conventional lithography and etching techniques are utilized to delineate the contact regions for the metallization film which results in the FIG. 1 resistor structure.

Figure 2:
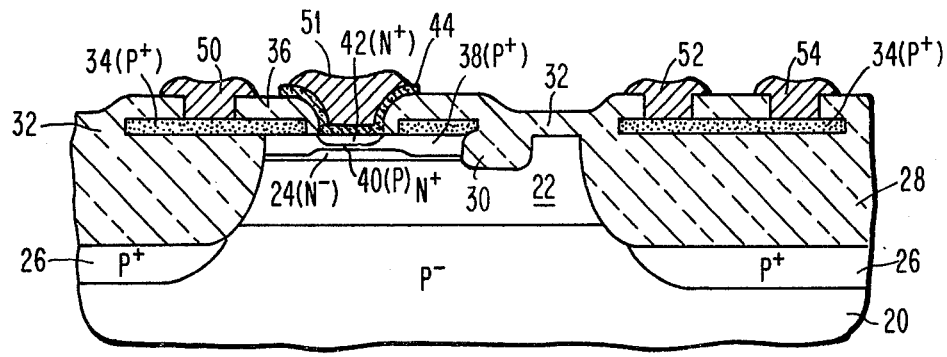
FIG. 2 shows a vertical cross-section of an integrated circuit which includes an NPN transistor and a polycrystalline silicon resistor made according to another form of the present invention.

Referring now more particularly to FIG. 2 for the manufacturing steps for a second form of the invention. This form of the invention utilizes a heavily boron doped polycrystalline silicon layer to form the extrinsic base for a bipolar transistor and a polycrystalline silicon resistor. The device is fabricated by starting with the wafer or substrate 20 of P- monocrystalline silicon material. The process is illustrated to form a NPN bipolar device integrated circuit. The FIG. 2 illustrates one small, greatly enlarged portion of the silicon body which will be used to form the very dense bipolar transistor structure. The P-substrate 20 has a subcollector N+ diffusion 22 made therein. An epitaxial N layer 24 is then grown on top of the substrate. These processes are standard processes in the formation of, for example, NPN bipolar transistors. The substrate is typically <100> crystallographic oriented silicon having a resistance in the order of 10 to 20 ohm centimeters. The subcollector diffusion is typically formed using arsenic having a surface concentration of about $10^{20}$ atoms/cm². The epitaxial growth process to form the layer 24 may be done by conventional techniques, such as the use of silicon tetrachloride/hydrogen or silane/hydrogen mixtures at temperatures between about 1000° C. to 1200° C. During the epitaxial growth, the dopant in the N+ subcollector layer moves into the epitaxial layer to complete the formation of the subcollector layer 22. The thickness of the epitaxial layer for highly dense integrated circuits is of the order of 3 micrometers or less. P+ regions 26 can also be formed in the substrate 20 in the designated areas under the recessed silicon dioxide isolation regions 28 are to be formed. These regions 26 also outdiffuse into the epitaxial layer as it is grown. The P+ regions 26 prevent the surface inversion and current leakage underneath the recessed silicon dioxide.

The next series of steps involve the formation of isolation means for isolating regions of monocrystalline silicon from other regions of monocrystalline silicon. The isolation may be back biasing PN junctions, partial dielectric isolation or complete dielectric isolation. The dielectric materials used may be silicon dioxide, glass, or combinations thereof, etc. The preferred isolation for highly dense integrated circuits is dielectric isolation. FIG. 2 shows a partial dielectric isolation with dielectric regions 28 and 30. The regions 28 isolate monocrystalline silicon regions from other monocrystalline silicon regions and region 30 isolates the base-emitter region from the collector reach-through region. There are many ways in the art to form dielectric regions of this type. One process for accomplishing this isolation is described in the Magdo et al. patent application, Ser. No. 150,609, filed June 7, 1971 or Peltzer U.S. Pat. No. 3,648,125. Alternatively, the partial dielectric isolation may be formed according to the methods described in either patent application Ser. No. 296,929, filed Aug. 27, 1981 by R. C. Joy et al. entitled "Isolation for High Density Integrated Circuits" or patent application Ser. No. 296,933, filed Aug. 27, 1981 by R. C. Joy et al. entitled "Isolation for High Density Integrated Circuits". In those patent applications and patent the processes for forming partial dielectric isolation for regions 28 and 30 are described in detail.

A mask layer 32 is provided over the semiconductor body covering those regions designated to be the emitter, intrinsic base and collector reach-through regions and open to those designated as the extrinsic base regions. The mask layer may be a chemical vapor deposited silicon dioxide layer of about 50 to 1000 nanometers in thickness. The preferred process for depositing such a layer is chemical vapor deposition. Alternatively, the mask layer may be comprised of a combination of layers of silicon dioxide and silicon nitride or other materials. The openings in the layer are formed by conventional lithography and masking procedures. A first P type undoped polycrystalline silicon layer 34 is formed uniformly over the surface of the silicon body wherein there are openings to the monocrystalline silicon body. The polycrystalline silicon body makes ohmic contact to these regions which are designated to be the extrinsic base regions. Elsewhere, the polycrystalline silicon layer is formed over the mask layer 32. The layer 34 may be deposited by use of a pyrolysis of silane at 625° C. The P type boron dopant is ion implanted into the layer 34 to the desired doping concentration. The operative thicknesses of the polycrystalline silicon layer 24 is between about 30 to 500 nanometers (with about 300 nanometers preferred). The preferred doping level is between dabout $3\times10^{19}$ to $3\times10^{20}$ atoms/cm³. The annealing or heating step as described above under the first form of the invention is now accomplished. During this step, the P+ extrinsic base 38 is formed by the movement of the P+ boron impurities into the N-epitaxial layer 24 from the P+ polycrystalline silicon layer.

Lithography and etching techniques are utilized to remove the polycrystalline silicon layer 34 from over the emitter, intrinsic base and collector reach-through areas. A layer 36 of silicon dioxide is then grown preferably by conventional thermal growth over the layer 34. Any silicon dioxide covering the emitter-base designated portion is removed by conventional etching techniques.

The intrinsic P base region 40 and the N+ emitter region 42 are now formed. This structure may be formed by successive ion implantations or diffusions. However, it is preferred to use an ion implantation method which is described in patent application Ser. No. 355,633 by F. Barson and B. M. Kemlage entitled "Method of Producing Shallow, Narrow Base Bipolar Transistor Structures" filed Mar. 8, 1982 now U.S. Pat. No. 4,431,460, and assigned to the same assignee as the present invention. This patent application describes a method for forming such a base and emitter region wherein a polycrystalline silicon layer is formed on the monocrystalline silicon surface in which the base and emitter regions of the transistor are to be formed. Boron ions are ion implanted into the polycrystalline silicon layer near the interface of the polycrystalline layer with the monocrystalline silicon layer. An annealing of the layer structure partially drives the boron into the monocrystalline silicon substrate. Arsenic ions are ion implanted into the polycrystalline silicon layer 44. A second annealing step is utilized to fully drive in the boron to form the base region and simultaneously therewith drive in the arsenic to form the emitter region of the transistor. This process involving a two-step annealing process for the boron implanting ions is necessary to create a base with sufficient width and doping to avoid punch-through. The polycrystalline silicon layer 44 remains as the emitter contact to the emitter region 42 in the final structure.

Contact openings are made through the insulating layer 36 to the extrinsic base contact regions and the resistor regions. A blanket metallization is accomplished through conventional metal evaporation techniques. Transition metals, aluminum, aluminum-copper and the like are utilized as the suitable metal. The metal layer is delineated by conventional lithography and eching techniques to form the metal contact 50 to the extrinsic base layer, metal contact 51 to the emitter and the metal contacts 52 and 54 to the resistor regions in the polycrystalline silicon layer 34.

To obtain higher sheet resistance it is possible to thin the polycrystalline silicon layer 14 or 34 either before or after ion implantation. The ways for thinning include reactive ion etching, chemical etching and thermal oxidation of a portion of the polycrystalline silicon followed by diluted HF to remove the oxidized polycrystalline silicon layer. Typically, one would remove the amount of polycrystalline silicon to give the desired sheet resistance. For example, resulting polycrystalline silicon layer of 50 nanometers or less would give a high sheet resistance resistor.

The following examples are included merely to aid in the understanding of the invention. Variations may be made by one skilled in the art without departing from the spirit and scope of the invention.

Examples 1, 2 and 3

Silicon wafers having a crystallographic orientation of <100> were thermally oxidized to a thickness of 50 nanometers. Undoped polycrystalline silicon films were prepared on each of the wafers by the thermal decomposition of pure silane at 625° C. and at pressures of 300 to 400 m Torr. The deposition rate was about 10 nanometers per minute. The resulting film thickness of this deposition was approximately 300 nanometers and are given in Table I. The polycrystalline silicon film was covered with 50 nanometers of silicon dioxide deposited by a vapor deposition of silane in nitrous oxide at 800° C. The polycrystalline silicon film was doped through the screen silicon dioxide using ion implantation of $5 \times 10^{15}$ boron/cm$^2$ at 50 KeV. The Example 1 wafer was annealed for 1 hour at 900° C. in a nitrogen atmosphere. The Example 2 wafers were annealed for 1 hour at 1000° C. in nitrogen ambient. The Example 3 wafers annealed for 1 hour at 110° C. in a nitrogen atmosphere. Thereafter, the screen oxide film was removed in dilute hydrofluoric acid. Table I shows the results of the process and tests made thereon.

TABLE I

| | Example 1 | Example 2 | Example 3 |
|---|---|---|---|
| Anneal temperature: | 900° C. | 1000° C. | 1100° C. |
| Film thickness [nm] | 324 | 312 | 306 |
| Free carrier concentr. [10$^{20}$/cm$^3$] | 0.75 | 1.05 | 1.10 |
| Mean crystallite size [nm] | 40 | 84 | 135 |
| Room temp. resistivity [m ohm cm] | 4.99 | 2.63 | 1.98 |
| Sheet resistance [ohm/sq.] | 154 | 84 | 64 |
| TCR (5–65° C.) [ppm deg$^{-1}$] | +66 | +505 | +846 |

The room temperature resistivities of these polycrystalline silicon films were measured with a square array four-point probe. Current and voltage probes as well as polarity were switched and the data evaluated according to van der Pauw's method as described in Philips Res. Repts. 13, 1–9 (1958). The resistivity values reported are the averages of at least 15 measurements per wafer. Their absolute accuracy is estimated to be better than ±5%. The temperature dependence of the resistance was measured on 8×8 mm$^2$ film samples cut from the same wafers. To avoid contact problems during temperature cycling, 1.5 mm aluminum dots were evaporated on to the corners of the squares and alloyed into the silicon. Current-voltage probes and polarity were reversed to reduce measurement errors. At room temperature, the resistivities from the two sets of measurements fell within 1–2% of each other. The resistances were measured from 5° to 65° C. in intervals of 5° C.

For grain size measurements, the silicon substrate and the thermal silicon dioxide film were etched away so that the polycrystalline silicon films could be examined by transmission electron microscopy. The diffraction patterns showed uniform rings with no indication of preferred orientation. Micrographs were taken under dark field conditions with images formed from beams diffracted at (220) and (331) oriented crystallites. Photographs at 47,000X magnification were evaluated by measuring all crystallites within a 3×3 μm$^2$ area. Each crystallite was measured along its largest and its shortest dimension and characterized by the average of the two values, l. After sorting all values into size categories, $l_i$, a mean grain size, L, was derived by summing over all crystallites:

$$L = \frac{\Sigma n_i l_i}{\Sigma n_i}$$

Although not all crystallities were counted because of the dark field conditions, the measured values are considered to be a representative subset of the total because of the observed random orientations (see the results given in Table I).

Figure 3:
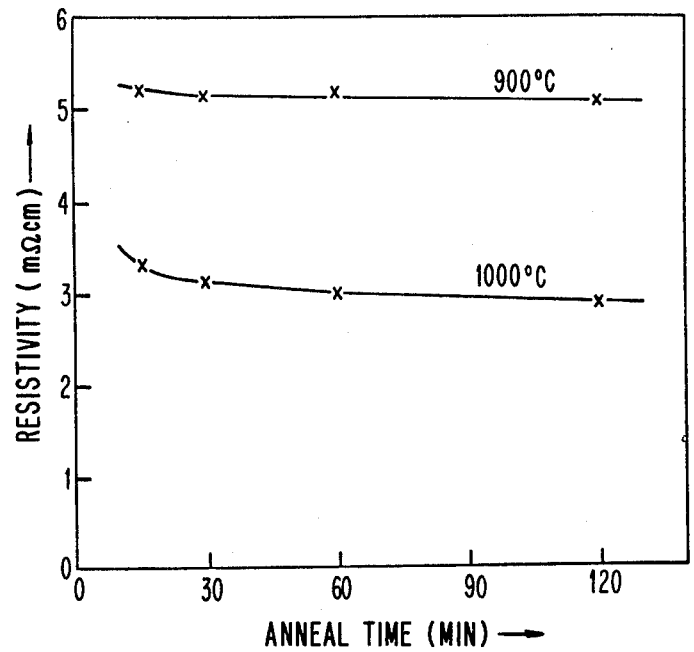
FIG. 3 shows the resistivity of polycrystalline silicon films as a function of annealing time in a nitrogen atmosphere for boron concentration of about $1.6 \times 10^{20}$ atoms/cm$^2$.

Post-implant annealing is necessary to activate the boron electrically and to obtain equilibrium distribution throughout the polycrystalline silicon film. FIG. 3 shows the resistivity of polycrystalline silicon films as a function of annealing time in nitrogen with boron concentrations about $1.6 \times 10^{20}$ atoms/cm$^3$. As shown in FIG. 3, the film resistivity is essentially stable after less than one hour of annealing. The small changes thereafter are attributed to slow grain growth. Rapid diffusion of boron in polycrystalline silicon at concentration below $1 \times 10^{20}$ atoms/cm$^3$ leads to a uniform distribution. At higher concentrations of boron in substantial excess of its solubility limit, the boron does not disperse uniformly due to a substantially lower diffusivity. Obviously, part of the boron has been precipitated and become electrically inactive after cooling.

Figure 4:
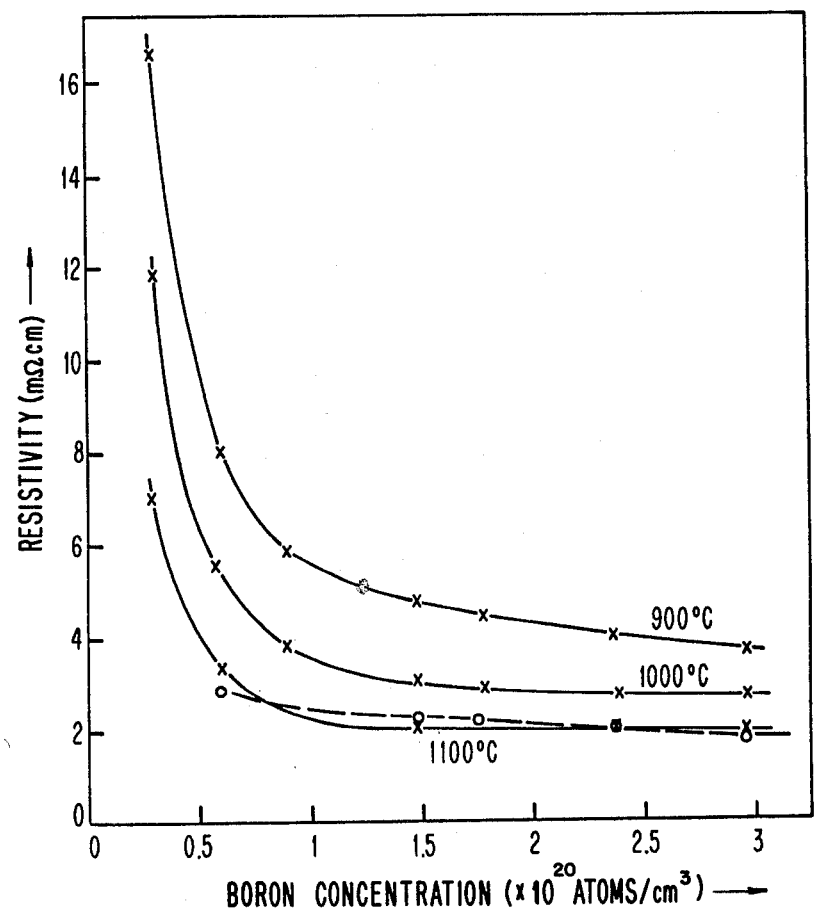
FIG. 4 illustrates the resistivity as a function of implanted boron concentration for temperatures of 900°, 1000° and 1100° C.

The resistivities of polycrystalline silicon films with boron concentrations near or slightly above the solubility limit are shown in FIG. 4. FIG. 4 shows the resistivity as function of implanted boron concentration. The drawn curves were annealed at different temperatures for 60 minutes after implantation. The dashed curve was annealed for 60 minutes at 1100° C. prior to, and for 60 minutes at 900° after implantation. As expected, the resistivities decrease with increasing acceptor concentration until the solubility limit is reached. For any given concentration, higher anneal temperatures produce lower resistivities. This effect is mostly due to increased hole mobilities rather than to the relatively small differences in solubility.

Figure 5:
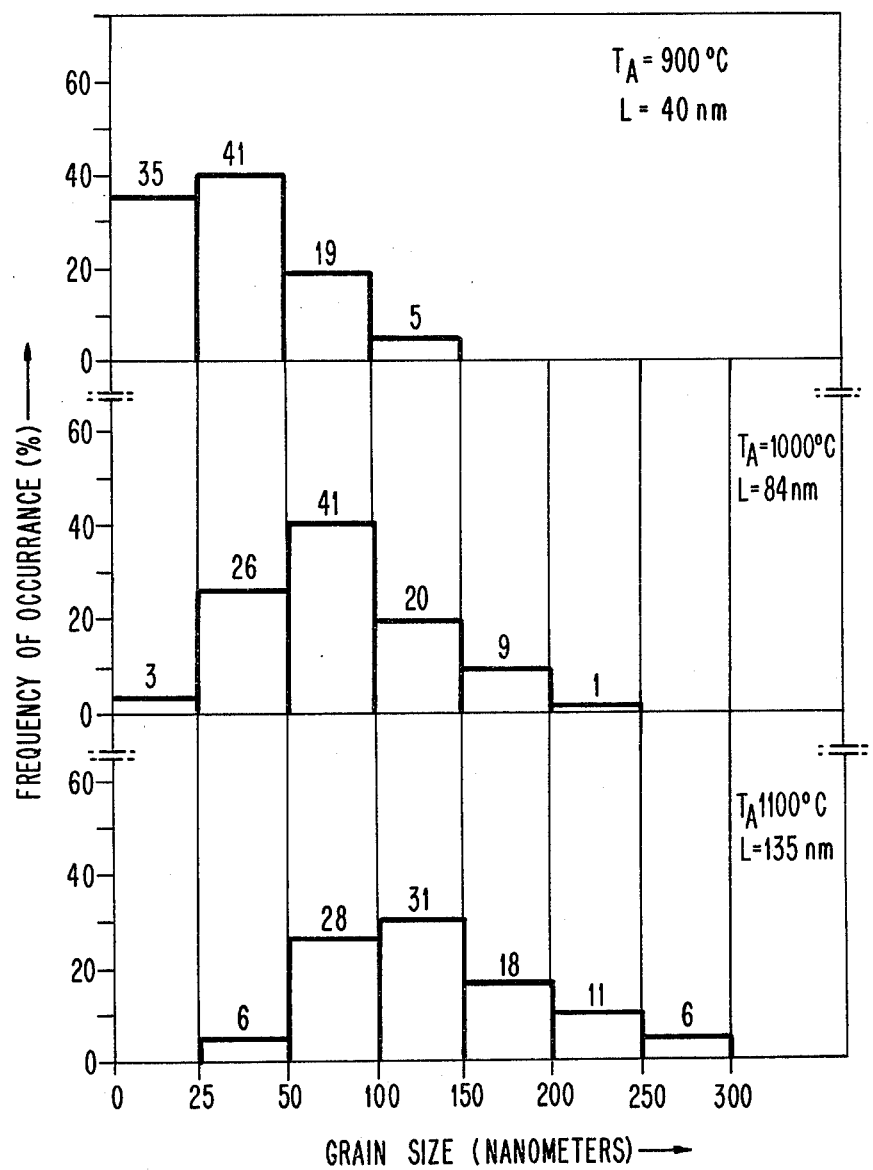
FIG. 5 shows grain size distribution in polycrystalline silicon films after annealing in nitrogen at three different temperatures.

The effect of annealing temperature on grain sizes is shown in FIG. 5. Grain size distributions in 300 nanometers thick polycrystalline silicon films after 60 minutes of annealing in nitrogen at three different temperatures are given in FIG. 5 for boron concentrations at about $1.6 \times 10^{20}$ atoms/cm$^3$. After one hour at 900° C. about one third of the crystallities are still smaller than 25 nanometers. These disappear completely as the annealing temperature is raised. An upper limit to grain growth is set by the thickness of the films. The mean grain sizes after 1000° C. and 1100° C. annealing are two and three times as large, respectively, as after the 900° C. heat treatment. The dashed line in FIG. 4 indicates that the same state of recrystallization is obtained if the annealing step is performed prior to boron implantation.

Figure 6:
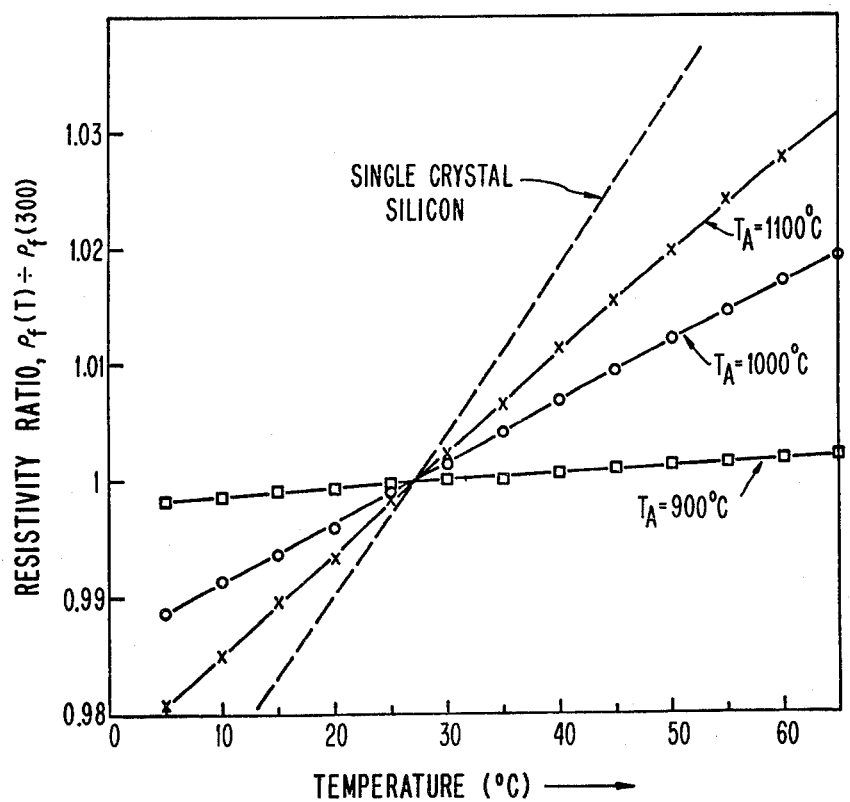
FIG. 6 illustrates the resistivity ratio of polycrystalline silicon films versus temperature for three annealing temperatures.

In lightly to moderately boron doped polycrystalline silicon films, the temperature dependence of the resistance is negative because the dominant conduction mechanism is thermally activated carrier transport across potential barriers at the grain boundaries. The heavily boron doped films of this investigation have small positive temperature coefficients of resistance (TCR) as is shown in FIG. 6. FIG. 6 shows a resistivity ratio, $\rho_f(T) \div \rho_f(300)$, of polycrystalline silicon films versus temperature for three anneal temperatures with boron concentration of about $1.6 \times 10^{20}$ atoms/cm$^3$. For fine-crystalline films ($T_A = 900°$ C.), the TCR is less than 100 ppm/°C. With increasing anneal temperature, the TCR becomes more positive and approaches the value of single crystalline silicon. Thus, grain boundaries decrease the TCR to values near or below zero.

For practical applications, polycrystalline silicon film resistors doped with boron at or slightly above the solid solubility limit are particularly advantageous. Their sheet resistance is not sensitive to small variations in implant dose (see FIG. 4), and the TCR can be made as low as 100 ppm/°C. Besides polycrystalline silicon film thickness, the most important variable to be controlled is the maximum temperature used in the fabrication process. This temperature determines the grain size and thereby the carrier mobility (sheet resistance) as well as the TCR of the films. Furthermore, the film resistance is independent of the voltage applied across the resistors in the range of practical interest.

While the invention has been particularly shown and described with reference to the preferred embodiments thereof, it will be recognized by those skilled in the art that the foregoing and other changes in form and details may be made without departing from the spirit and scope of the invention.

What is claimed is:

1. A method for making a polycrystalline silicon resistor comprising:
   depositing a polycrystalline silicon layer of very fine grain size upon an insulator surface;
   ion implanting boron into said polycrystalline silicon layer approximately equal to or in excess of the solid solubility limit of said polycrystalline silicon at between about $3 \times 10^{19}$ and $3 \times 10^{20}$ atoms/cm$^3$;
   thermally annealing the said polycrystalline silicon layer at a temperature of less than about 1100° C. to control the grain size of the said polycrystalline silicon layer resistor to be between about a few nanometers and 300 nanometers;
   and making contacts to said layer as said resistor.

2. The method of claim 1 wherein said polycrystalline silicon is deposited by pyrolysis of silane at a temperature between about 600° to 750° C.

3. The method of claim 1 wherein said insulator surface is composed of silicon dioxide.

4. The method of claim 1 and further comprising etching the said polycrystalline silicon layer to thin said layer prior to said ion implanting boron.

5. The method of claim 1 wherein said annealing is done at a temperature between about 800° to 1100° C. for 15 to 180 minutes.

6. The method of claim 3 wherein said silicon dioxide forms a part of the dielectric isolation of an integrated circuit structure.

7. The method of claim 6 wherein said polycrystalline silicon layer is formed simultaneously with an extrinsic polycrystalline silicon contact layer base on the extrinsic base region of a bipolar transistor.

8. The method of claim 7 wherein said ion implantation is simultaneously done into said extrinsic base and said polycrystalline silicon resistor layer.

9. The method of claim 8 wherein the average said grain size after said annealing is less than about 150 nanometers.

10. The method of claim 7 wherein said annealing is done at a temperature between about 800° to 1100° C. for 15 to 180 minutes to simultaneously drive in the said boron from the external base contact into the monocrystalline silicon extrinsic base and to homogenize the distribution of said boron atoms and raise the concentration of said boron in the silicon grains to the solubility limit of said resistor.

11. The method of claim 4 wherein said etching is by reactive ion etching and said layer is thinned to a layer of less than about 50 nanometers.

12. The method of forming an integrated circuit which includes an NPN transistor and a resistor comprising:
   providing a silicon semiconductor body having regions of monocrystalline silicon dielectrically isolated from one another by dielectric isolating regions;
   providing a mask over the surface of said body having said isolating regions therein covering all regions except those regions designated to be the extrinsic base regions;
   depositing a polycrystalline silicon layer of very fine grain size over the said mask and said designated extrinsic base regions;
   ion implanting boron equal to or in excess of the solid solubility limit of said polycrystalline silicon;
   thermally annealing the said polycrystalline silicon layer to simultaneously control the grain size in said layer and drive in the said boron from the said layer into said designated external base region;
   removing portions of said polycrystalline silicon layer by lithography and etching to delineate external base contact and resistors in said polycrystalline silicon layer; and
   making contacts to said external base contacts and to said resistors.

13. The method of claim 12 wherein said resistors are located over said dielectric isolating regions.

14. The method of claim 12 wherein said polycrystalline silicon layer is partially thermally oxidized before said ion implanting boron to act as a screen silicon dioxide layer.

15. The method of claim 12 wherein the boron concentration in resulting said polycrystalline silicon layer is between about $3 \times 10^{19}$ atoms/cm$^3$ to $3 \times 10^{20}$ atoms/cm$^3$.

16. The method of claim 12 wherein the said grain size after said annealing is less than about 150 nanometers.

17. The method of claim 14 wherein the said thickness polycrystalline silicon layer is between about 30 to 500 nanometers and the thickness of said silicon dioxide layer is between about 20 to 100 nanometers.

* * * * *

UNITED STATES PATENT AND TRADEMARK OFFICE
CERTIFICATE OF CORRECTION

PATENT NO. : 4,467,519

DATED : August 28, 1984

INVENTOR(S) : Reinhard Glang and Alfred Schmitt

It is certified that error appears in the above-identified patent and that said Letters Patent is hereby corrected as shown below:

[21] "Appl. No.: 384,371" should read --Appl. No.: 364,371--

Signed and Sealed this

Twelfth Day of February 1985

[SEAL]

Attest:

DONALD J. QUIGG

Attesting Officer     Acting Commissioner of Patents and Trademarks